(12) United States Patent
Bindrup et al.

(10) Patent No.: US 9,741,680 B1
(45) Date of Patent: Aug. 22, 2017

(54) WIRE BOND THROUGH-VIA STRUCTURE AND METHOD

(71) Applicant: PFG IP LLC, Tiburon, CA (US)

(72) Inventors: Randy Bindrup, Costa Mesa, CA (US); W. Eric Boyd, Costa Mesa, CA (US); John Leon, Costa Mesa, CA (US); James Yamaguchi, Costa Mesa, CA (US); Angel Pepe

(73) Assignee: PFG IP LLC, Tiburon, CA (US)

( * ) Notice: Subject to any disclaimer, the term of this patent is extended or adjusted under 35 U.S.C. 154(b) by 0 days.

(21) Appl. No.: 15/250,701

(22) Filed: Aug. 29, 2016

Related U.S. Application Data

(62) Division of application No. 13/209,898, filed on Aug. 15, 2011, now Pat. No. 9,431,275.

(60) Provisional application No. 61/403,518, filed on Sep. 17, 2010.

(51) Int. Cl.
*H01L 23/00* (2006.01)
*H01L 23/498* (2006.01)

(52) U.S. Cl.
CPC ............ *H01L 24/45* (2013.01); *H01L 23/498* (2013.01); *H01L 23/49811* (2013.01); *H01L 24/05* (2013.01); *H01L 2224/04042* (2013.01); *H01L 2224/45541* (2013.01)

(58) Field of Classification Search
CPC ....... H01L 24/82; H01L 24/96; H01L 25/105; H01L 24/10; H01L 24/01; H01L 23/3164

USPC ................. 257/737, 782, E21.502, E23.023; 438/124

See application file for complete search history.

(56) References Cited

U.S. PATENT DOCUMENTS

| | | | |
|---|---|---|---|
| 5,953,588 A | 9/1999 | Camien et al. | |
| 6,072,234 A | 6/2000 | Camien et al. | |
| 6,117,704 A | 9/2000 | Yamaguchi et al. | |
| 6,706,971 B2 | 3/2004 | Albert et al. | |
| 6,784,547 B2 | 8/2004 | Pepe et al. | |
| 6,797,537 B2 | 9/2004 | Pepe et al. | |
| 6,806,559 B2 | 10/2004 | Gann et al. | |
| 7,174,627 B2 | 2/2007 | Gann | |
| 7,768,113 B2 | 8/2010 | Ozguz et al. | |
| 7,872,339 B2 | 1/2011 | Gann et al. | |
| 7,919,844 B2 | 4/2011 | Ozguz et al. | |
| 8,420,430 B2 | 4/2013 | Chiu et al. | |
| 2007/0246819 A1 | 10/2007 | Hembree et al. | |
| 2007/0254406 A1* | 11/2007 | Lee | H01L 25/0657 438/109 |
| 2008/0042247 A1* | 2/2008 | Wood | H01L 23/3114 257/669 |
| 2009/0014858 A1* | 1/2009 | Boon | H01L 21/4853 257/686 |

\* cited by examiner

*Primary Examiner* — Walter H Swanson
(74) *Attorney, Agent, or Firm* — Thomas M. Freiburger

(57) ABSTRACT

A stackable integrated circuit chip layer and module device that avoids the use of electrically conductive elements on the external surfaces of a layer containing an integrated circuit die by taking advantage of conventional wire bonding equipment to provide an electrically conductive path defined by a wire bond segment that is encapsulated in a potting material so as to define an electrically conductive wire bond "through-via" accessible from at least the lower or second surface of the layer.

1 Claim, 3 Drawing Sheets

WIRE BOND THROUGH-VIA STRUCTURE AND METHOD

CROSS REFERENCE TO RELATED APPLICATIONS

This application is a division of application Ser. No. 13/209,898, filed Aug. 15, 2011, now Ser. No. 9,431,275, which claimed benefit of U.S. Provisional Patent Application No. 61/403,518, filed on Sep. 17, 2010 entitled "Wire Bond Through-Via Structure and Method" pursuant to 35 USC 119, which application is incorporated fully herein by reference.

STATEMENT REGARDING FEDERALLY SPONSORED RESEARCH AND DEVELOPMENT

N/A

BACKGROUND OF THE INVENTION

1. Field of the Invention

The invention relates generally to the field of electrical interconnection of stacked microelectronic assemblies.

More specifically, the invention relates to a stackable device that avoids the use of electrically conductive elements on the external surfaces of a layer containing an integrated circuit die by taking advantage of conventional wire bonding equipment to provide an electrically conductive path that is encapsulated in a potting material so as to define an electrically conductive wire bond "through-via" that is accessible from at least the lower surface of the layer.

2. Description of the Related Art

The ability to fabricate very thin, stackable layers containing one or a plurality of homogeneous or heterogeneous integrated circuit chips is desirable and allows high density, high speed electronic systems to be assembled for use in military, space, security and other applications.

Examples of such layers and modules are disclosed in U.S. Pat. No. 6,706,971; Stackable Microcircuit Layer Formed from a Plastic Encapsulated Micro-Circuit; U.S. Pat. No. 7,768,113, Stackable Tier Structure Comprising Prefabricated High Density Feedthrough, U.S. Pat. No. 7,919,844 Tier Structure With Tier Frame Having Feedthrough Structure, U.S. Pat. No. 7,174,627, Method of Fabricating Known Good Dies from Packages Integrated Circuits; U.S. Pat. No. 6,806,559, Method and Apparatus for Connecting Vertically Stacked Integrated Circuits; U.S. Pat. No. 6,797,537, Method of Making Stackable Layers Containing Encapsulated Integrated Circuit Chips With One or More Overlying Interconnect Layers; U.S. Pat. No. 7,872,339, Vertically Stacked Pre-Packages Integrated Circuit Chips; U.S. Pat. No. 6,784,547, Stackable Layers Containing Encapsulated Integrated Circuit Chips With One or More Overlying Interconnect Layers; U.S. Pat. No. 6,117,704, Stackable Layer Containing Encapsulated Chips; U.S. Pat. No. 6,072,234, Stack of Equal Layer Neo-Chips Containing Encapsulated IC Chips of Different Sizes, and U.S. Pat. No. 5,953,588, Stackable Layers Containing Encapsulated IC Chips.

The stacking and interconnection of very thin microelectronic layers permits high circuit speeds in part because of short lead lengths and related reduced parasitic impedance and electron time-of-flight. These desirable features, combined with a very high number of circuit and layer interconnections, beneficially provide relatively large I/O designs to be implemented in a small volume.

The assignee of the instant application, Irvine Sensors Corporation, has been a leader in developing high density packaging of IC chips, originally for use in focal plane modules, and then for use in a variety of computer functions, such as memory. Generally, stacking of IC chips has emphasized use of identical-area chips, each of which performs the same function. The resulting stack is a rectangular parallelepiped (or cube) having substantially planar outer surfaces. One or more of the outer surfaces may have an access plane or side bus in electrical communication with the IC circuitry of the stacked chips, in order to permit connection to external circuitry.

Irvine Sensors was initially "stacking silicon" by obtaining prefabricated silicon wafers having integrated circuitry defined as individual die thereon from a wafer manufacturer, metalizing an upper surface of the wafer to connect each die's bond pads to an edge that is later formed when the die is diced from the wafer; dicing stackable die from the metalized wafer; stacking the stackable die to form die-stacks, and then forming edge connections on one or more sides of each die stack. Irvine Sensors identified certain challenges in fabricating such die stacks by stacking silicon die, however, for several reasons.

First, it was difficult to buy complete prefabricated wafers, for a number of supply chain-based reasons and the fact the wafer manufacturers do not want to reveal their yield or expose their built-in test structures that could make it easier to reverse engineer their circuitry, because the manufacturers do not usually have an existing sales structure for selling whole wafers and because the manufacturers were concerned about liability issues if the stacked product should come to include a defective die.

Second, it is sometimes difficult to form the edge connections on the die stacks because they must be defined upon within the dicing streets (the inactive die surface area between the individual integrated circuit die on the wafer) that have grown continually narrower as dicing technologies have improved. For example, the typical dicing street may be 6 mils or less and the saw kerf may be about 1.5 mils with poor registration relative to the die. As a result, a die's original metallization may be undesirably exposed to the edge and thereby making it troublesome to form further access plane metallization along that edge without shorting or damaging the die circuitry.

Third, the probability of having a defective die in any one die-stack increases dramatically on the basis of the number of wafers in the wafer stack.

As a result of the foregoing problems associated with silicon bare die stacking, Irvine Sensors developed a technology involved creating "neo-wafers" and then stacking "neo-chips" diced from the neo-wafers.

As disclosed more fully in the foregoing patents, the inventors make a "neo-wafer" by providing a bare IC die (preferably pre-tested or "known good" die); arranging the bare die in a spaced arrangement within a wafer-shaped fixture; and then pouring a potting material such as epoxy onto the bare die within the wafer-shaped fixture. The neo-wafers, after being removed from the fixture, are surface metalized and the potted die are cut from the neo-wafers to provide "neo-chips" of equal area that are suitable for stacking. A significant benefit of neo-wafers and neo-chips is that known good die may be used and different sized and number of die may be incorporated into same sized neo-chips.

None of the above prior art devices or methods provides a device that comprises one or more through vias that permit interconnection from the upper surface of an IC to the lower surface thereof to facilitate stacking of such die. What is needed is a device that combines the above attributes but that can be fabricated using well-defined processes at relatively low cost.

BRIEF SUMMARY OF THE INVENTION

A stackable integrated circuit chip layer and module device is provided that avoids the use of electrically conductive elements on the external surfaces of a layer containing an integrated circuit die by taking advantage of conventional wire bonding equipment to provide an electrically conductive path defined by a wire bond segment that is encapsulated in a potting material so as to define an electrically conductive wire bond "through-via" accessible from at least the lower or second surface of the layer.

In a first aspect of the invention, an electronic device is provided comprising a layer defining a first surface and a second surface, an integrated circuit chip having an active surface with a bond pad and an inactive surface, a cross-section of an encapsulated wire bond segment in electrical connection with the bond pad and exposed on the second surface of the layer.

In a second aspect of the invention, the electrical connection with the bond pad is a conductive lead assembly.

In a third aspect of the invention, the conductive lead assembly comprises an electrically conductive trace.

In a fourth aspect of the invention, the conductive lead assembly comprises a stud bump or equivalent conductive structure.

In a fifth aspect of the invention, a method for making an electronic device is disclosed comprising the steps of bonding the inactive surface of an integrated circuit chip having a bond pad to a metalized surface of a substrate, disposing a wire bond loop having a predetermined height on the metalized surface at a predetermined location with respect to the bond pad, encapsulating a predetermined portion the wire bond loop and the integrated circuit chip to define a first surface and a second surface, removing a predetermined portion of the encapsulant and the wire bond loop from the first surface to define a wire bond segment having a first terminal end and a second terminal end, electrically connecting the bond pad to the first terminal end of the wire bond segment using a conductive lead assembly, and, exposing the second terminal end of the wire bond segment on the second surface.

In a sixth aspect of the invention, the conductive lead assembly of the process comprises a conductive trace.

In a seventh aspect of the invention, the conductive lead assembly of the process comprises a stud bump in electrical communication with the bond pad.

In an eighth aspect of the invention, the second terminal end of the process is exposed by the step of removing the substrate.

In a ninth aspect of the invention, an electronic device provided by a process comprising the steps of bonding the inactive surface of an integrated circuit chip having a bond pad to a metalized surface of a substrate, disposing a wire bond loop having a predetermined height on the metalized surface at a predetermined location with respect to the integrated circuit chip, encapsulating a predetermined portion the wire bond loop and the integrated circuit chip to define a first surface and a second surface, removing a predetermined portion of the encapsulant and the wire bond loop on the first surface to define a wire bond segment having a first terminal end and a second terminal end, electrically connecting the bond pad to the first terminal end of the wire bond segment using a conductive lead assembly, and, exposing the second terminal end of the wire bond segment on the second surface.

In a tenth aspect of the invention, the conductive lead assembly of the device of the process comprises a conductive trace.

In an eleventh aspect of the invention, the conductive lead assembly of the device of the process comprises a stud bump in electrical communication with the bond pad.

In a twelfth aspect of the invention, the second terminal end of the device of the process is exposed by the step of removing the substrate.

In a thirteenth aspect of the invention, an electronic module or device comprising a plurality of stacked layers is provided wherein a first layer and a second layer each comprise a first surface and a second surface, an integrated circuit chip having an active surface with a bond pad and an inactive surface, a cross-section of an encapsulated wire bond segment in electrical connection with the bond pad and exposed on the second surface of the layer and wherein the first layer is in electrical communication with the second layer such as by electrical connection between the first surface of a first layer and the second surface of the second layer.

These and various additional aspects, embodiments and advantages of the present invention will become immediately apparent to those of ordinary skill in the art upon review of the Detailed Description and any claims to follow.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

The device and method of the invention beneficially avoid the need for conductive elements disposed on the external surfaces of devices or assemblies and which can be damaged or tampered with, by incorporating vertical, conductive wire bond segments within a potting compound or encapsulant which is especially useful on tamper-resistant devices and assemblies. Such a configuration further enables such concealed vertical interconnections to be used with a single die of any size and/or on multiple die assemblies, each of the same or different size.

The method of the invention may be used to stack memory or processor die on top of each other with a simple BGA interconnect or any type of die may be used preferably in applications were the common footprint is established from the largest sized die in the stack.

The following process steps generally describe a preferred embodiment of the invention and a preferred set of process steps for making same.

Turning now to the figures wherein like numerals define like elements among the several views, a stackable integrated circuit chip layer and module device that uses a wire bond segment to provide a "through-via" accessible from at least the lower or second surface of the layer is disclosed.

Figure 1:
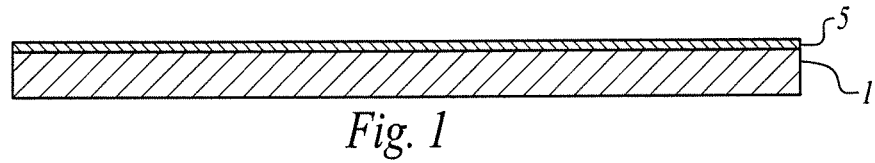
FIG. 1 shows a metalized layer on the substrate.

As seen in FIG. 1, a suitable sacrificial substrate 1 is provided which may be comprised of, for instance, an FR-4 PWB material, silicon material, aluminum material or equivalent substrate material whose properties are preferably compatible with the potting encapsulant material to be used; and that can be metalized by suitable means and can be processed by photolithography is selected. The sacrificial substrate 1 dimensions are preferably selected to accommodate the tail ends of wire bond loops.

At least one surface of the selected substrate 1 is then metalized such as by vacuum deposition, plating, or other means preferably using a wire bondable metal to define a metalized layer 5. The deposited metal layer 5 is preferably thick enough to allow wire bonding.

Figure 2:
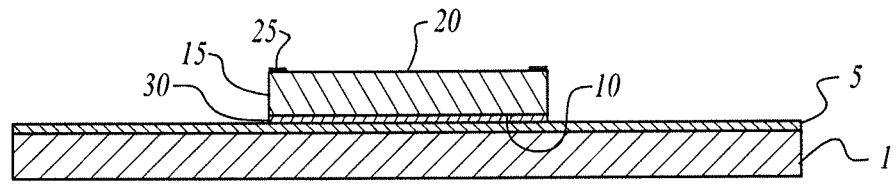
FIG. 2 shows an integrated circuit chip attached by a film adhesive to the substrate.

As seen in FIG. 2, the inactive surface 10 of integrated circuit chip 15 to be processed is bonded to the substrate 1 with active surface 20 comprising one or more contact bond pads 25 to be interconnected facing up at a predetermined location which locations may be determined by the geometry of the required interconnections. The adhesive material 30 used to bond the integrated circuit chip 15 to metalized layer 5 may be an epoxy that is compatible with the potting compound and the substrate material.

Figure 3:
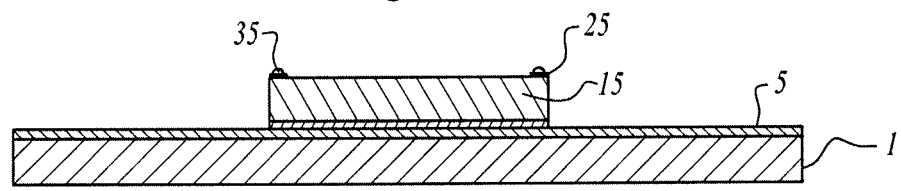
FIG. 3 shows gold stud bumps applied to bond pads on the active surface of the integrated circuit die of FIG. 2.

As seen in FIG. 3, after integrated circuit chip 15 is bonded to substrate 1, separately provided stud bumps or equivalent conductive structures 35 may be applied to bond pads 25 which stud bumps 35 may exposed in subsequent processing steps as is further discussed below.

Figure 4:
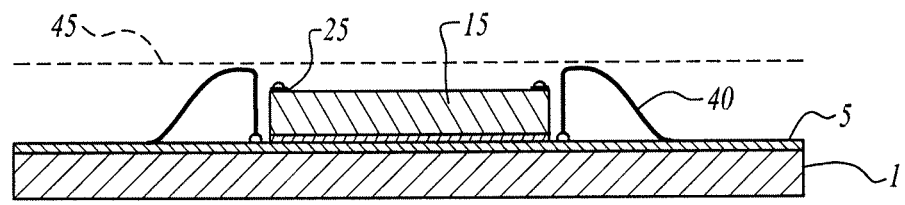
FIG. 4 shows a wire bond loop, a portion of which will function as a wire bond via, applied to the metalized surface of the substrate.

Turning to FIG. 4, a separately provided wire bond loop 40 is disposed at one or more predetermined locations on metalized layer 5 with respect to the bond pad locations on integrated circuit chip 15.

Conventional wire bonding equipment may be programmed to index the bonding sequence off a selected bond pad 25 location on the integrated circuit chip 15 under process.

Metalized layer 5 on the substrate 1 is wire bonded to define a wire bond loop 40 having a predetermined height 45. The wire bonder may be programmed to maximize the vertical distance it travels, and its verticality, before the bond bends over and down to terminate the bonding operation further out and away from integrated circuit chip 15 on the substrate 1.

In a preferred embodiment, a conductive metal wire bond loop and segment comprises a wire material such as a gold, copper and aluminum material of diameter on the order of about 0.002" or larger diameter used with by wire bonding equipment, which wire material desirably has a much larger current carrying capacity than, for example, vacuum deposited metals used for similar interconnection purposes.

Figure 5:
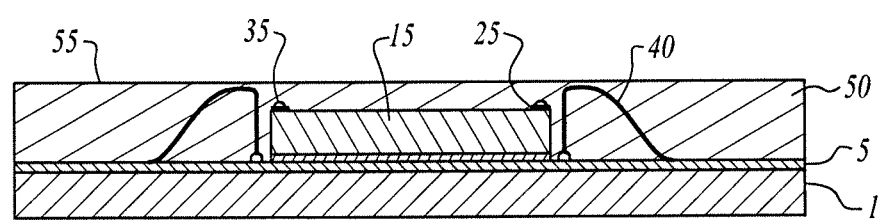
FIG. 5 shows the integrated circuit die encapsulated in a potting compound.

As seen in FIG. 5, the assembly is encapsulated or "potted" in an encapsulant 50, using a suitable potting compound such as Hysol FP4562, by embedding the assembly in the potting material preferably until it encapsulates all or at least a portion of stud bumps 35, integrated circuit chip 15 and wire bond loop 40 up a predetermined height which may comprise the entirety of wire bond loop 40. The predetermined height may be up to at least the bending position of the highest of the wire bond loops on the assembly.

Once the encapsulant is cured, the assembly defines a first surface 55 and a second surface 60.

Figure 6:
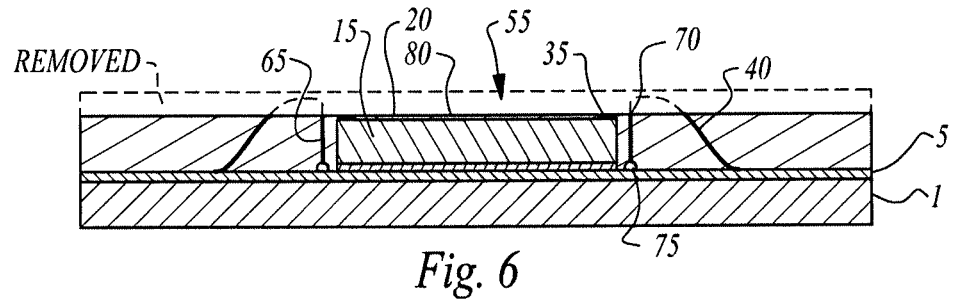
FIG. 6 shows the assembly where a predetermined portion of first surface of the assembly has been removed to expose a portion of the one or more gold stud bumps.

As depicted in FIG. 6, a predetermined portion of first surface 55 of the potted structure (i.e. the surface opposing substrate 1) is removed such as by grinding or lapping until a predetermined portion of stud bumps 35 on integrated circuit chip 15 are exposed without exposing the active surface 20 of integrated circuit chip 15 itself which would damage the integrated circuitry thereon. Concurrently, the removal of a predetermined portion of first surface 55 removes a portion or wire bond loop 40 to define wire bond segment 65.

Wire bond segment 65 defines an exposed cross-section as a first terminal end 70 and a second terminal end 75 (which may be the wire ball bond of the wire bond loop). The wire cross-section as terminal end 70 is exposed in a separately-provided grinding process step of the removal of a predetermined portion of the first surface 55 of the assembly.

In an alternative embodiment of the device and process of the invention, the wire bond loop fabrication step may be eliminated and the wire bond segment 65 instead may comprise a stack of wire bond machine "stud bumps", which may be "coined" as is known in the wire bonding arts. The stack of stud bumps have the equivalent function and acts as wire bond segment 65 and which may be applied in electrical communication with substrate 1. The stack of stud bumps in this alternative embodiment may be applied at predetermined locations on substrate 1 using a conventional wire bonding machine such as is available from West Bond, Inc. If stud bumps are used in lieu of a wire bond loop, the wire bond equipment is preferably capable of generating a relatively uniform stud bump height.

The alternative stud bump embodiment of the wire bond segment 65 structure of the invention comprises multiple, stacked stud bumps that are formed by the use of wire bonding equipment. As is known in the wire bond arts, columns of wire balls, or stud bumps may be fabricated on the substrate 1 at a predetermined pitch, encapsulated in the dielectric encapsulant material and then the substrate and a predetermined portion of the encapsulant removed as by grinding, lapping, or back-thinning. The terminal surfaces of the stud bump stack through-via structure are ground as part of the grinding process to expose the stud bump stack terminal ends 55 and 60 in the columns. The resultant structure then comprises an array of encapsulated conductive columns suitable for use in the instant invention.

The average height of a stud bump formed with 2-mil Au wire is about 80 um in height. Since a two-mil wire is usually the maximum size that wire bonders can run, the stud bumping operation should be monitored to observe the overall stud bump height tolerances which may quickly change from stack to stack due to compression forces and stack tilt.

A thin residual layer 80 of the dielectric potting epoxy will remain disposed on active surface 20.

Figure 7:
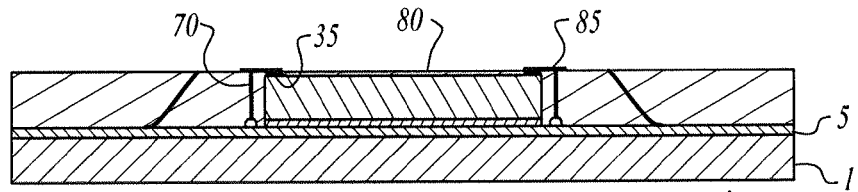
FIG. 7 shows re-route traces applied to the assembly to define a conductive lead assembly from the exposed surface of the stud bump to the exposed cross-section of the encapsulated wire bond segment.

As illustrated in FIG. 7, desired electrical interconnections in the form of metalized conductive lead assemblies 85 are fabricated using well-understood photolithographic and plating process or by equivalent process means, to delineate conductive trace routings from the exposed stud bump 35 and exposed first terminal end 70.

Note the grinding or lapping operation may be used both to bring the assembly to a predetermined thickness and at the same time to expose cross-section of the wire bond loops applied by wire bonding.

Figure 8:
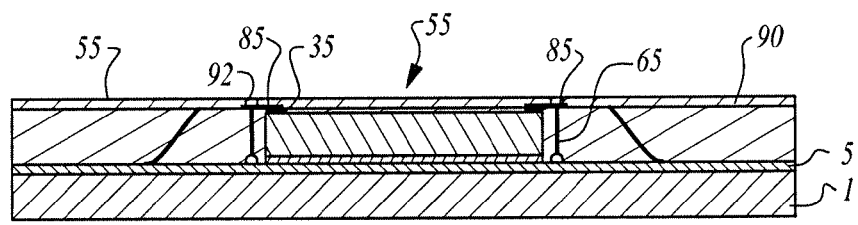
FIG. 8 shows a dielectric layer applied over the conductive lead assembly and first surface.

FIG. 8 shows a dielectric layer or coating 90 is disposed on first surface 55. In a preferred embodiment, one or more apertures or vias 92 may be defined in the dielectric layer 90 to expose a portion of one or more the electrically conductive lead assemblies 85 and to permit the receiving of and electrical connection with external circuitry such as, one or more solder balls on the second surface of a layer of the invention in a stacked plurality of layers of the invention as illustrated in FIG. 11A.

Figure 9:
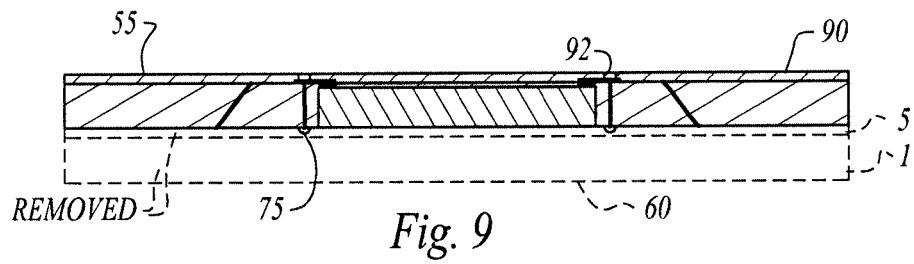
FIG. 9 shows the substrate and metalized layer removed from the assembly.

As seen in FIG. 9, a predetermined portion of second surface 60 which may include substrate 1 and metalized layer 5 is removed such as by lapping or grinding until second terminal end 75 is exposed or until a predetermined die thickness is obtained, or both or at which point substrate 1 and metalized layer 5 have been completely or almost completely removed.

Figure 10:
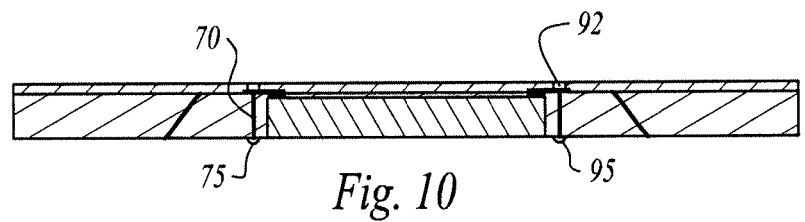
FIG. 10 shows a contact pad and solder ball on the second surface of the assembly.

As illustrated in FIG. 10, once the second surface of the assembly has been lapped to the final thickness, bond pads or solder balls 95 may be applied to the second surface of the assembly to complete the through-via structure.

Figure 11:
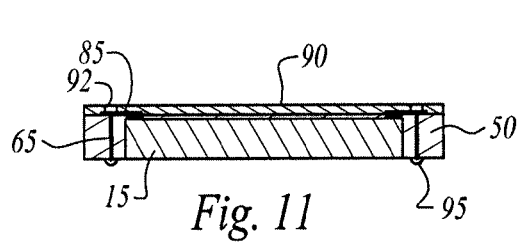
FIG. 11 shows a preferred embodiment of the device of the invention after dicing to final dimensions.
Figure 11A:
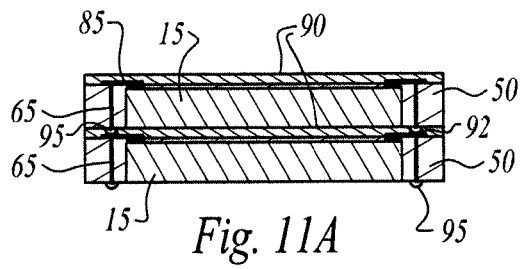
FIG. 11A shows a stack of the layers of the invention bonded and in electrical communication with each other to define a three dimensional micro-electronic module.

As seen in FIG. 11, the assembly may be diced to final size eliminating the remaining wire bond portions or tails, resulting in an integrated circuit chip layer suitable for stacking in a multilayer microelectronic module using one or more wire vertical thru-via structures.

As best seen in FIG. 11A, in the preferred embodiment of the device, an aperture or via 92 is provided in dielectric layer 90 to expose at least a portion of electrically conductive structure 85 for electrical connection to another circuit, such as, for instance, a second layer of the invention in a stacked configuration. The electrical connection between the layers may be achieved by, for instance, a solder ball, solder paste, Z-conductive epoxy or equivalent electrical connection means.

In a preferred embodiment, the integrated circuit die thickness is from about 10 mils to about 32 mils in thickness, the wire bond look height is about 2 mm and the substrate thickness from about 60 mils to about 90 mils.

In a preferred embodiment, a plurality of rows of vertical wire bond loops are disposed around the perimeter of the die with a inside row having a distance of about 5 mm from ball to wedge and the outside row having a distance of about 3 mm from ball to wedge.

In a preferred embodiment of the final device of the invention, the first row of vertical wire bond segments may be about 0.35 mm from the vertical edge of the die and having a pitch of about 0.35 mm. The final diced size is preferably about 1 mm beyond the outermost row of vertical wire bond segments.

Figure 12:
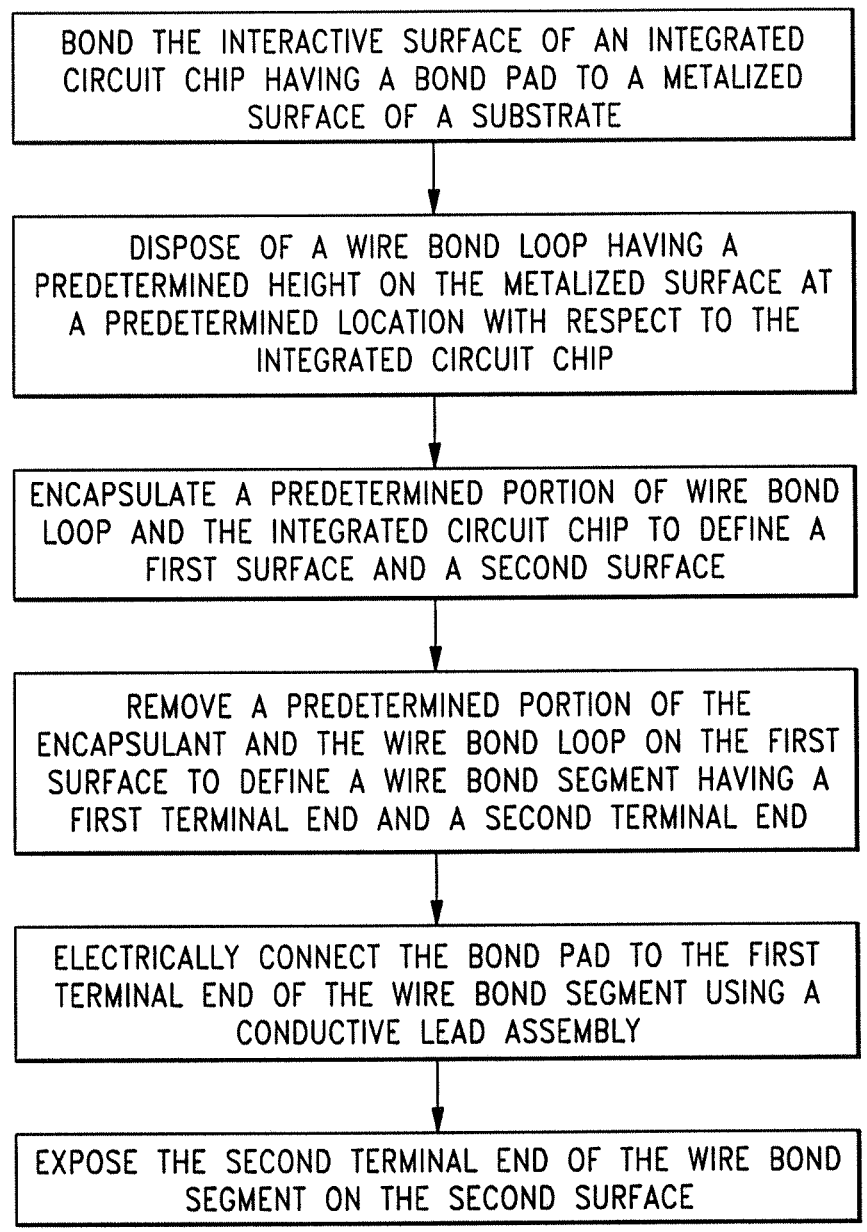
FIG. 12 illustrates a set of process steps in a preferred process of the invention.

Finally, as seen in FIG. 12, a set of process steps is shown that illustrate a preferred process of the invention.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An electronic device comprising a plurality of stacked layers wherein a first layer and a second layer each comprise:

a first surface and a second surface, an integrated circuit chip having an active surface with a bond pad and an inactive surface, a cross-section of an encapsulated wire bond segment in electrical connection with the bond pad and exposed on the second surface of the layer, the wire bond segment being adjacent to the integrated circuit chip and within an encapsulant and extending from said cross-section through the encapsulant to the first surface of the layer, and, wherein the first layer is in direct electrical communication with the second layer, without any intervening chip carrier between the first and second layers, whereby the stacked layers occupy a space only slightly greater than the integrated circuit chips.

* * * * *